United States Patent
van der Cammen

(10) Patent No.: US 9,651,591 B2
(45) Date of Patent: May 16, 2017

(54) METHOD FOR USING AN ACCURATE ADJUSTABLE HIGH-FREQUENCY PHASE-DETECTOR

(71) Applicant: Catena Holding B.V., Delft (NL)

(72) Inventor: Peter van der Cammen, Delft (NL)

(73) Assignee: CATENA HOLDING B.V., Delft (NL)

( * ) Notice: Subject to any disclaimer, the term of this patent is extended or adjusted under 35 U.S.C. 154(b) by 0 days.

(21) Appl. No.: 15/111,569

(22) PCT Filed: May 18, 2015

(86) PCT No.: PCT/SE2015/000031
§ 371 (c)(1),
(2) Date: Jul. 14, 2016

(87) PCT Pub. No.: WO2015/190971
PCT Pub. Date: Dec. 17, 2015

(65) Prior Publication Data
US 2016/0349297 A1     Dec. 1, 2016

Related U.S. Application Data

(60) Provisional application No. 62/010,471, filed on Jun. 11, 2014.

(51) Int. Cl.
*H03K 3/00*     (2006.01)
*G01R 25/00*     (2006.01)
(Continued)

(52) U.S. Cl.
CPC ............... *G01R 25/00* (2013.01); *H03D 7/14* (2013.01); *H03D 7/1433* (2013.01);
(Continued)

(58) Field of Classification Search
CPC . A61B 5/02055; A61B 5/4058; A61B 5/4818; A61M 2016/0033; A61M 2021/0011
See application file for complete search history.

(56) References Cited

U.S. PATENT DOCUMENTS

| 6,985,035 | B1 | 1/2006 | Khorramabadi |
| 2001/0027095 | A1* | 10/2001 | Wang ................. H03D 7/1433 |
| | | | 455/285 |

(Continued)

FOREIGN PATENT DOCUMENTS

| WO | 02084859 | 11/2002 |
| WO | 2008018034 | 2/2008 |

(Continued)

*Primary Examiner* — Sibin Chen
(74) *Attorney, Agent, or Firm* — Fasth Law Offices; Rolf Fasth

(57) ABSTRACT

The method determines an input phase differential (Δφ) between two input signals. A phase detector is provided that has pairs of transistors and a first impedance (R1) connected to a first branch carrying a first signal (Iout_left) and a second impedance (R2) connected to a second branch carrying a second signal (Iout_right). The first signal (Iout_left) in the first branch is set as a first sum of a common mode output signal (Icm) and a differential mode output signal (Idm). The second signal (Iout_right) in the second branch is set as a second sum of the common mode output signal (Icm) minus the differential mode output signal (Idm). A relationship between the first impedance (R1) and the second impedance (R2) is adjusted until a differential mode output voltage (Vdm) of the phase detector is zero. The input phase differential (Δφ) is determined when the differential mode output voltage (Vdm) is zero.

22 Claims, 14 Drawing Sheets

(51) Int. Cl.
*H03D 7/14* (2006.01)
*H03K 5/26* (2006.01)
*H03D 13/00* (2006.01)

(52) U.S. Cl.
CPC ............ *H03D 7/1458* (2013.01); *H03K 5/26* (2013.01); *H03D 13/00* (2013.01)

(56) References Cited

U.S. PATENT DOCUMENTS

| | | |
|---|---|---|
| 2010/0090723 A1 | 4/2010 | Nedovic et al. |
| 2011/0142113 A1 | 6/2011 | Hokazono et al. |

FOREIGN PATENT DOCUMENTS

| | | |
|---|---|---|
| WO | 2011059842 | 5/2011 |
| WO | 2013156060 | 10/2013 |

\* cited by examiner

METHOD FOR USING AN ACCURATE ADJUSTABLE HIGH-FREQUENCY PHASE-DETECTOR

This application is a U.S. national phase application based on International Application No. PCT/SE2015/000031, filed 18 May 2015 that claims priority from U.S. Provisional Patent Application No. 62/010,471, filed 11 Jun. 2014.

TECHNICAL FIELD

The invention relates to a method for using an accurate adjustable high-frequency phase-detector.

BACKGROUND AND SUMMARY OF THE INVENTION

A well-known phase detector circuit is the double-balanced mixer or Gilbert cell 100, as shown in FIG. 1. Two differential signals are applied to this mixer cell and the differential output voltage of the mixer is then used as the information source for the phase difference. V1 (V1plus–V1minus) is applied to the upper pairs of transistors 102a, 102b and V2 (V2plus–V2minus) is applied to the lower pair of transistors 104a, 104b. Whenever the voltage V2p is higher than the voltage V2m, the current will take the left branch 106a and when V2m is higher than V2p the current will take the right branch 106b. When a square way signal is connected to the bottom pair V2p and V2m, the current will alternatively and continually switch between the branches 106a and 106b. The $I_{tail}$ currents of the upper pairs of transistors 102a, 102b, 102c and 102d are controlled by the bottom pair of transistors 104a and 104b. Similarly, whenever V1p is higher than V1m, the current will alternatively take the left branches 108a and 108b and via collector resistor Rc1. The current will take the right branches 108a2 and 108b2 and via collector resistor Rc2 when the voltage V1m is higher than V1p. The mixer output is connected to the supply rail (Vcc) via two collector resistors Rc. V1 and V2 are considered to be sufficiently high so that the mixer is switching properly. If in that case, the average value 110 of the differential output voltage of the mixer is plotted as a function of the input phase-difference, the output phase-characteristic is obtained, as shown in FIG. 2. The output voltage VPD-Out is zero when the phase difference is 90 degrees and approximates Rc*$I_{tail}$ when the phase difference is 180 degrees. When the phase difference is 0 degree, this is equivalent to the current taking the furthest left branch of the mixer 100 in FIG. 1 and when the phase difference is 180 degrees, this is equivalent to the current taking the furthest right branch in the mixer 100. The capacitors are here used to realize the averaging. The double balanced mixer 100 is a phase detector of a multiplicative type. The phase characteristic is periodic with tops that are 'rounded off' due to, for example, a certain inertia or switching slowness of the transistors. Depending on the mixer speed and input frequency, the area where the positive and negative tops of the phase characteristics are 'rounded off' can be smaller or larger. The imperfections of the transistors in the mixer are particularly apparent at and close to phase differences of 0 or 180 degrees. One problem of the prior art mixer 100 is that the average output voltage which is used to represent the phase difference of the two square input signals, is not accurate.

In the prior art systems, the approximate input phase-difference $\Delta\phi$ is determined by examining the average differential output voltage and using a reference voltage. The maximum (extrapolated) output voltage corresponds to $I_{tail}$*Rc wherein $I_{tail}$ is the mixer tail current and Rc is the collector resistor value of the resistors. The output phase difference is then approximately:

$$\Delta\phi = 90 + 90*\{V_{PD-Out}/(I_{tail}*Rc)\} \text{ degrees}$$

When the output phase difference $\Delta\phi$ is 45 degrees, the average voltage $V_{PD-Out}$ is about $I_{tail}$*Rc/2. As indicated above, the use of $I_{tail}$ in the formula is not correct due to the losses in the mixer 100 and the real value of the current (I) coming out of the top part of the mixer 100 can be substantially different from $I_{tail}$ especially at high frequencies. However, it is difficult to determine what this value of the current (I) should be. Thus, the above approximation has a many accuracy drawbacks, as listed below:

1. The assumption that the sum of the two output currents of the mixer is identical to the tail current $I_{tail}$ which is not correct. Because of the finite beta of the transistors and all kinds of parasitic effects (like injection in the substrate), this assumption is not completely true. The value of $I_{tail}$*Rc in the above formula should be corrected somewhat but this correction factor is not very predictable and is difficult to determine because it depends on temperature, process and other properties that are difficult to determine. The sum of the two currents (left and right side) coming out of the mixer 100 is thus different from the incoming current $I_{tail}$.

2. The 'rounding off' in the positive and negative tops of the characteristic affects illustrates an undesirable flaw of deviation partly due to speed problems of the transistors i.e. the transistors cannot turn on and off quickly enough when the phase differences are very small. The further away from the 90 degrees input phase-difference, the larger the deviation becomes and the flaw reaches its maximum and 0 and 180 degrees. The most accurate phase measurement is done when the phase difference is exactly 90 degrees and the output differential-voltage $V_{PD-Out}$ is zero.

3. There is an additional error due to the fact that the voltages at the two outputs of the mixer are not the same for input phase-differences other than 90 degrees. In that case, the collector to emitter bias voltage of the transistors in the upper mixer pair are not the same which affects the above assumption as well in a way that is not very predictable.

4. Since the load the mixer forms for the two input signals is not the same (V1 is connected to the double top pair which is connected with its collectors to the output and V2 is connected to the single bottom pair which is connected with its collectors to the common emitter nodes of the top pair), the phase difference that corresponds to a 0 Volt differential output voltage is not exactly 90 degrees, but is somewhat shifted due to the imbalance of the mixer 100 in that the upper transistors consist of 4 transistors while the lower transistors only consist of 2 transistors. In other words, because of this, the complete phase characteristics is shifted in the x-direction.

As shown in FIG. 3, it is possible to correct this imbalance by placing a second mixer 112 in parallel that is connected to the same input signals that are now 'swapped' i.e. V1 is connected to the bottom pair of transistors while V2 is connected to the top pairs of transistors.

The conventional way of translating the mixer output voltage $V_{PD-Out}$ into a phase difference is problematic because:

1. A voltage reference is needed that is proportional to $I_{tail}$*Rc,

2. A correction should be realized that accommodates for inaccurate transistor properties like finite beta, temperature and process dependency, 3. An extra error can be expected due to speed limitations that will be there for all input phase differences which is to be more severe further away from 90 degrees and which finally results in the undesirable 'rounding off' of the tops of the characteristic, 4. An extra partly unpredictable deviation from the ideal phase characteristic can be expected when the average differential mixer output voltage differs from 0V, and 5. An error can be expected due to the asymmetrical loading of the input signals.

The method of the present invention provides a solution to many of the above-outlined problems. It solves problems 1, 2 and 4 above. Problem 3 is a fundamental problem for all mixer circuits. However, since the phase detector of the present invention has a differential mixer output voltage of zero, the present invention performs better with respect to problem 3 also. Problem 5 is not solved but can be compensated in the same way as with conventional phase detectors by using a second mixer with swapped inputs in parallel. More particularly, the method determines an input phase differential (Δϕ) between two input signals such as sine inputs that have been converted to square wave signals by limiter amplifiers. An important feature of the present invention is that there is no need for using a standard voltage reference at all because an important notion is that the input phase differential is contained in the ratio of the differential mode and common mode output currents. Although instead of determining the ratios of the differential mode and common mode output currents, it would be just as good to measure the ratio of the differential and common mode output voltages when the mixer collector resistors are identical (because Vcm=Icm*Rc and Vdm=Idm*Rc). The ratio of the differential mode current and the common mode current is here used an illustrative example. In other words, no voltage is measured relative to a standard voltage reference (like a band-gap reference). Instead, the output voltage differential relative to the common mode voltage is determined instead. If voltages are measured it is preferred that the two mixer collector resistors (Rc1 and Rc2) are identical. Therefore, the ratio between the differential mode current (Idm) and the common mode current (Icm) is preferably used instead. It is to be understood that it is quite difficult to determine the phase differential by measuring the differential mode voltage (Vdm) and divide this by the common mode voltage (Vcm). It is much easier to instead use a standard voltage reference (such as $Rc*I_{tail}$) which is one reason why the ratio between differential voltage mode and the common mode voltage has not been used before to determine the phase differential in a mixer. It is easier, as was done in the past, to predict the common mode voltage as accurate as possible by using the voltage reference and generating the tail current of the mixer from it by using the same type of resistor. The output differential voltage may thus be used to derive the phase difference by measuring the common mode voltage and use that as a reference. It is less accurate to try to predict the common mode voltage (compensation) as it was done in the past. A second important notion of the present invention is that the phase information can not only be derived from the ratio of the differential mode and common mode voltage but that the primary ratio for determining the phase difference is the ratio between the differential mode current (Idm) and the common mode current (Icm). As described in detail below, a third important notion of the present invention is that when the two resistors of the mixer are not the same, a potentiometer can surprisingly be used to indicate what the ratio of the differential mode current (Idm) and the common mode current (Icm) is.

More particularly, a high-frequency phase detector is provided that has pairs of transistors and a first impedance (R1) connected to a first branch carrying a first signal (Iout_left) and a second impedance (R2) connected to a second branch carrying a second signal (Iout_right). The first signal (Iout_left) in the first branch is set as a first sum of a common mode output signal (Icm) and a differential mode output signal (Idm). The second signal (Iout_right) in the second branch is set as a second sum of the common mode output signal (Icm) minus the differential mode output signal (Idm). A relationship between the first impedance (R1) and the second impedance (R2) is adjusted until a differential mode output voltage (Vdm) of the phase detector is zero. The input phase differential (Δϕ) is determined when the differential mode output voltage (Vdm) is zero.

DETAILED DESCRIPTION

Figure 4:
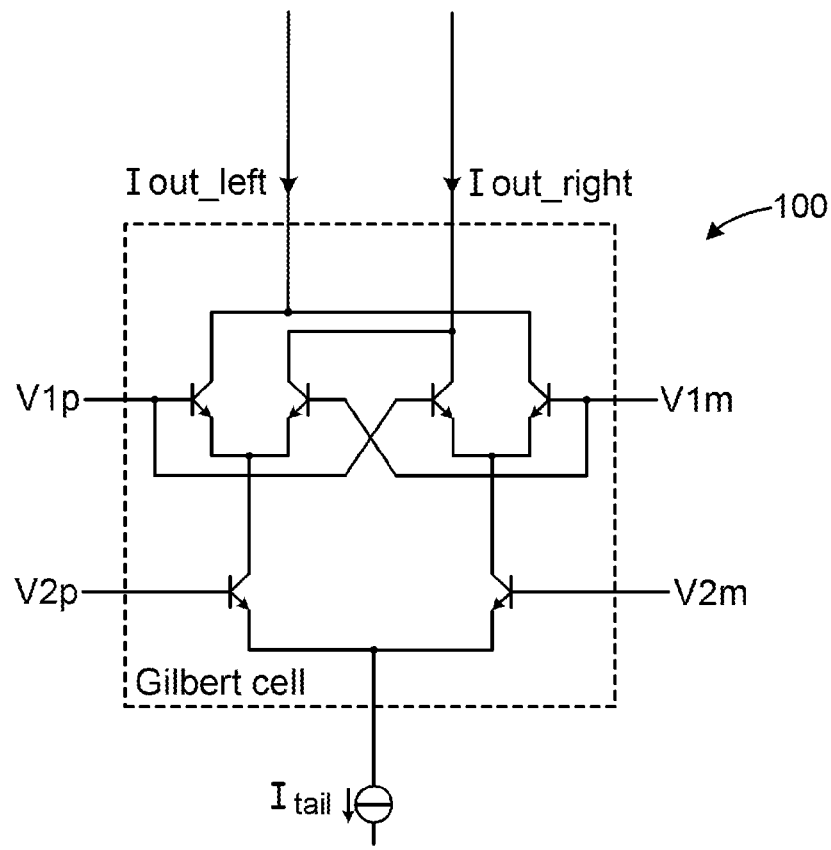
FIG. 4 is a schematic view of a prior art mixer i.e. a Gilbert cell without collector resistors.

An important notion of the present invention is that the sum of the two currents coming out of the top part of the mixer 100 is not the same as $I_{tail}$. As shown in FIG. 4, the present invention is a phase detector, based on the double-balanced mixer or Gilbert cell 100 that does not have many of the short-comings from the list of drawbacks.

Figure 1:
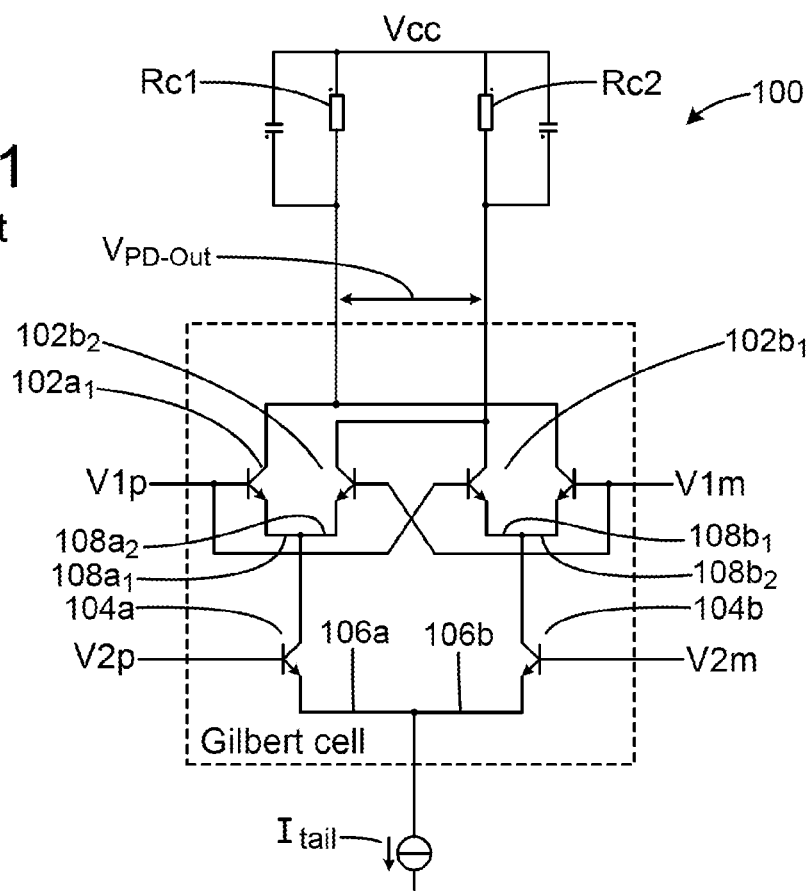
FIG. 1 is a schematic view of a prior art double-balanced mixer i.e. a Gilbert cell.
Figure 2:
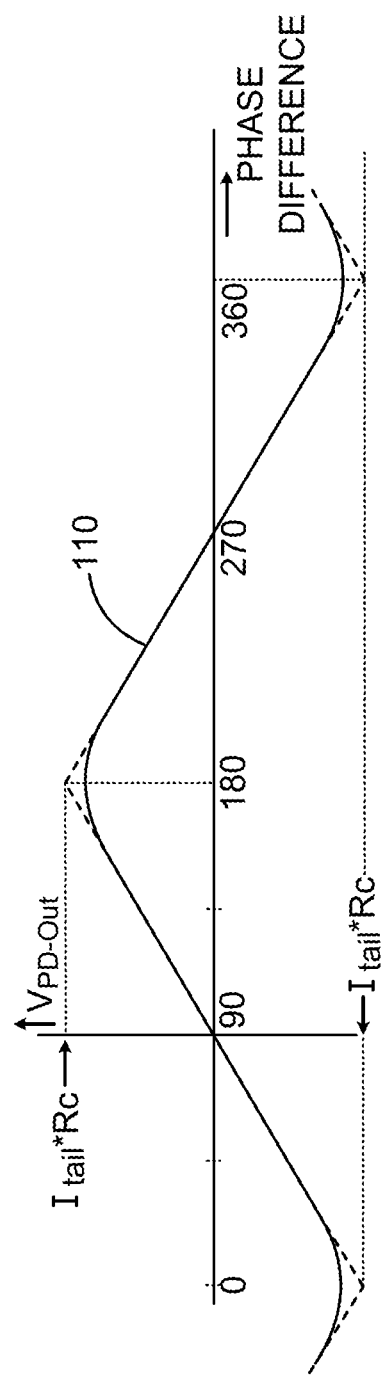
FIG. 2 is a curve showing an average value of the differential output voltage as a function of the input phase-difference.
Figure 3:
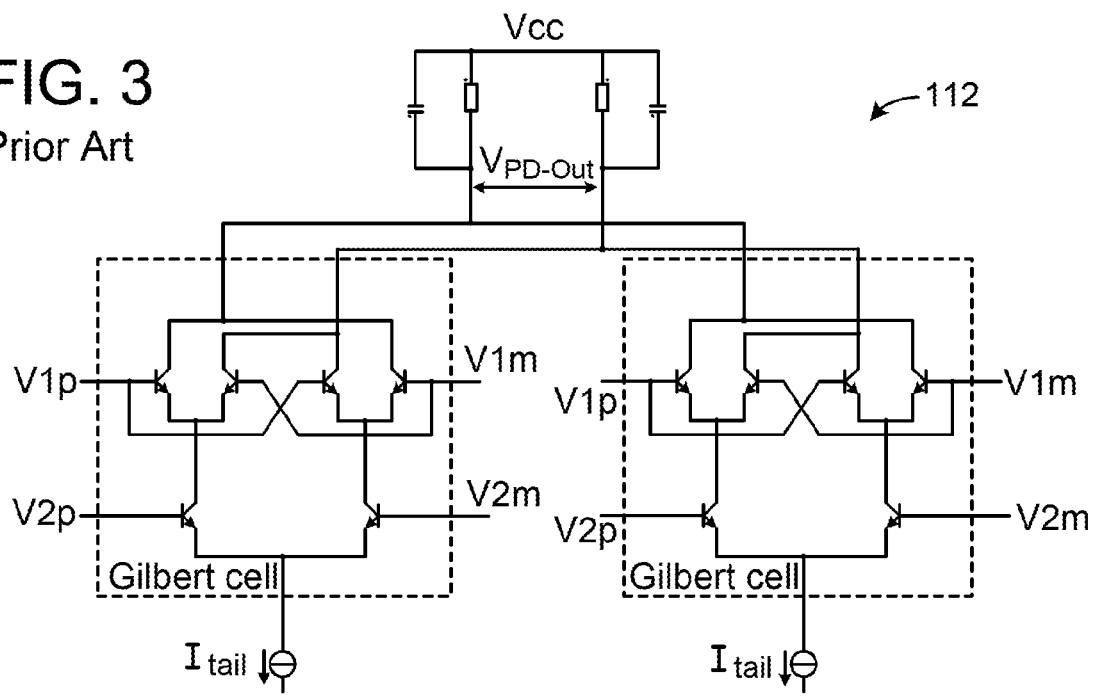
FIG. 3 is a schematic view of two prior art mixers in parallel connected to the same input signal.

It is here assumed that the 5$^{th}$ error is zero or negligible. As described above, the conventional way of using the Gilbert cell or mixer 100 is to rely on voltage differentials relative to a voltage reference (such as $I_{tail}*Rc$ in FIG. 1) because they are relatively easy to measure as opposed to measuring current differentials. One important and surprising notion is that the relationship between the input phase-difference $\Delta\phi$ and the output currents of a double balanced mixer or Gilbert cell can be described as:

$$\Delta\phi=(-90*Idm/Icm)+90 \text{ degrees,}$$

Figure 5:
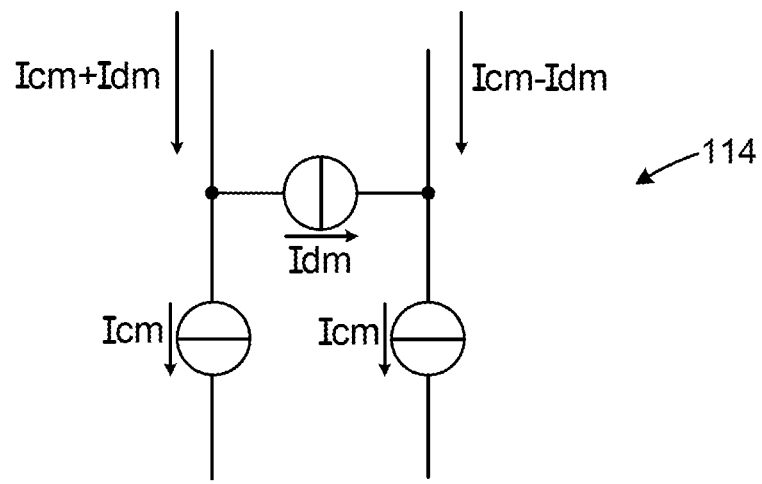
FIG. 5 is a visualization of the definition of the common mode output current Icm and differential mode output current Idm.

An important idea of the present invention is to split up the current into a common mode output-current Icm and a differential mode output-current Idm although it is difficult to measure the ratio between two currents. Although the information is in Idm/Icm, preferably the measurements are only made when Vdm=0, when the ratio of the load resistors or the position of the potentiometer is read, as will be explained later. It is to be understood that the setting of Vdm to zero is only used an illustrative example of the present invention. It is possible to settle for a non-zero differential output voltage Vdm and correct for this later. Inaccuracy due to inaccurate resistor ratios may remain. Inaccuracy due to absolute resistor values (for example, all resistors are 20% higher) have no effect on the end result. It is to be understood that the ratio between Vdm/Vcm may also be used (which is the same thing particularly when Rc1=Rc2 in FIG. 1) and the Idm/Icm ratio is here used as an illustrative example. It is more accurate to include Icm and Idm in the equation than to considering the output voltage because that involves the resistors R1 and R2 which adds another source of inaccuracies. Icm represents the current value that is the same between the left and the right branches coming out of the mixer 100 while Idm represents the part of the two currents that is different. Icm and Idm are defined as the two mixer output currents, as shown in simplified mixer 114 of FIG. 5, and described below:

$$Icm=(Iout\_left+Iout\_right)/2$$

$$Idm=(Iout\_left-Iout\_right)/2$$

This may be rewritten, as shown below:

$$Iout\_left=Icm+Idm$$

$$Iout\_right=Icm-Idm$$

Icm is about $I_{tail}/2$ but, as mentioned above, in reality the true value is different due to the inaccuracies described above such as finite beta, temperature differences, injection and all kinds of large and small signal frequency-dependent properties as a result of the fact that Iout_left+Iout_right is not the same as $I_{tail}$. It is an important and surprising notion that $I_{tail}$ should not be used as a reference current and that Icm should be used as reference current value instead. It should be noted that the error due to error number 2 (imperfect transistor properties) in the list above is not present in equation (1) below:

$$\Delta\phi=(-90*Idm/Icm)+90 \text{ degrees.} \quad (1)$$

In other words, by using Idm and Icm only, there is no need to make the incorrect assumption that Iout_left+Iout_right must be the same as $I_{tail}$.

Another important and surprising notion is that by applying a variable (resistive) load that results in a zero volt differential output-voltage at each current input phase-difference yields a simple relationship between the input phase-difference $\Delta\phi$ and the load resistor-ratios. This notion is used to measure the ratios between two currents which is something that is very difficult to do, as mentioned above.

Figure 6:
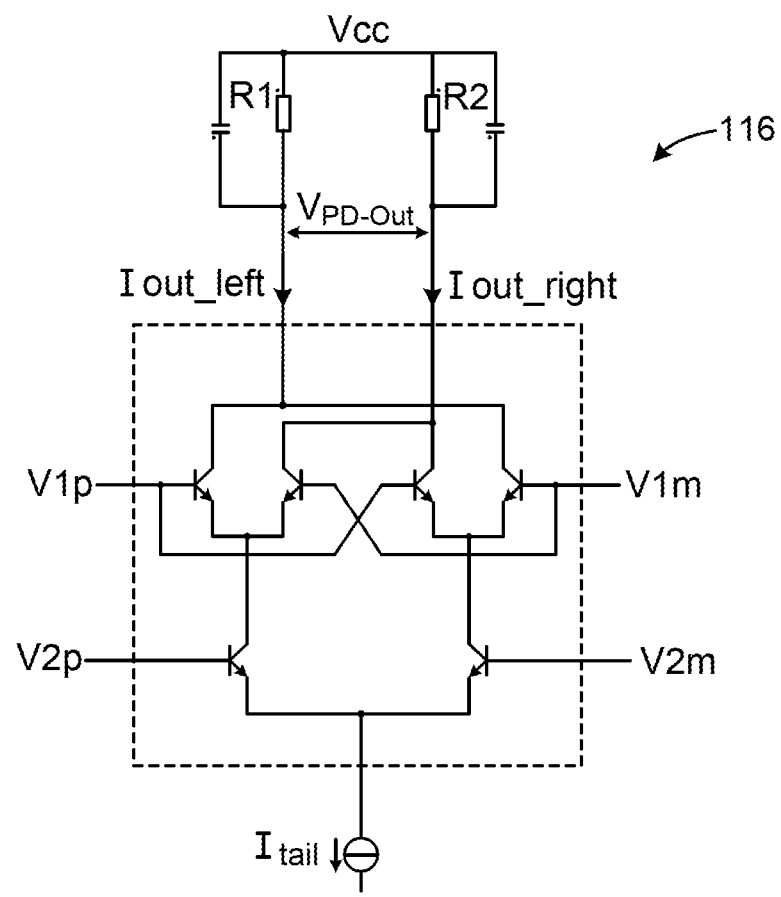
FIG. 6 is a schematic view of a Gilbert cell having two different resistors R1 and R2 and capacitors for low pass filtering.

FIG. 6 shows a mixer 116 two different output resistors R1 and R2 of the Gilbert cell. The values of resistors R1 and R2 are not necessarily the same but they are selected so that the differential output voltage is always zero i.e. $V_{PD\text{-}Out}=0$ V. It is also possible to let the system settle at a known non-zero value and correct later for this. However, in the preferred embodiment the differential output voltage is zero. One advantage of making the differential output voltage equal to zero means that biasing of the transistors in the two branches is the same. This means the voltage drop across both resistors R1 and R2 are identical:

$$V_{PD\text{-}Out}=Iout\_left*R1-Iout\_right*R2=0 \text{ V}$$

or:

$$Iout\_left*R1=Iout\_right*R2$$

or:

$$(Icm+Idm)*R1=(Icm-Idm)*R2$$

or:

$$Idm(R1+R2)=Icm(R2-R1)$$

This may be rewritten as:

$$Idm/Icm=(R2-R1)/(R2+R1)$$

and a substitution in the equation (1) leads to:

$$\Delta\phi=-90*\{(R2-R1)/(R2+R1)\}+90 \text{ degrees}$$

When the sum of R1 and R2 is kept constant, then there is a simple linear relationship between the difference R1−R2 and the input phase difference $\Delta\phi$. It should be understood that the sum of R1 and R2 does not have to be a constant although this is convenient due to the linear relationship that makes it easy to use a linear scale. Preferably, the resistors R1 and R2 should be matching to the extent that they should both go up in temperature and have the same or similar accuracy to make the ratio between the two predictable since the important thing is not the absolute values of the two resistors but the ratio between the two resistors. The differential voltage should, preferably always, be zero when the determination of the value of the phase difference $\Delta\phi$ is made.

Figure 7:
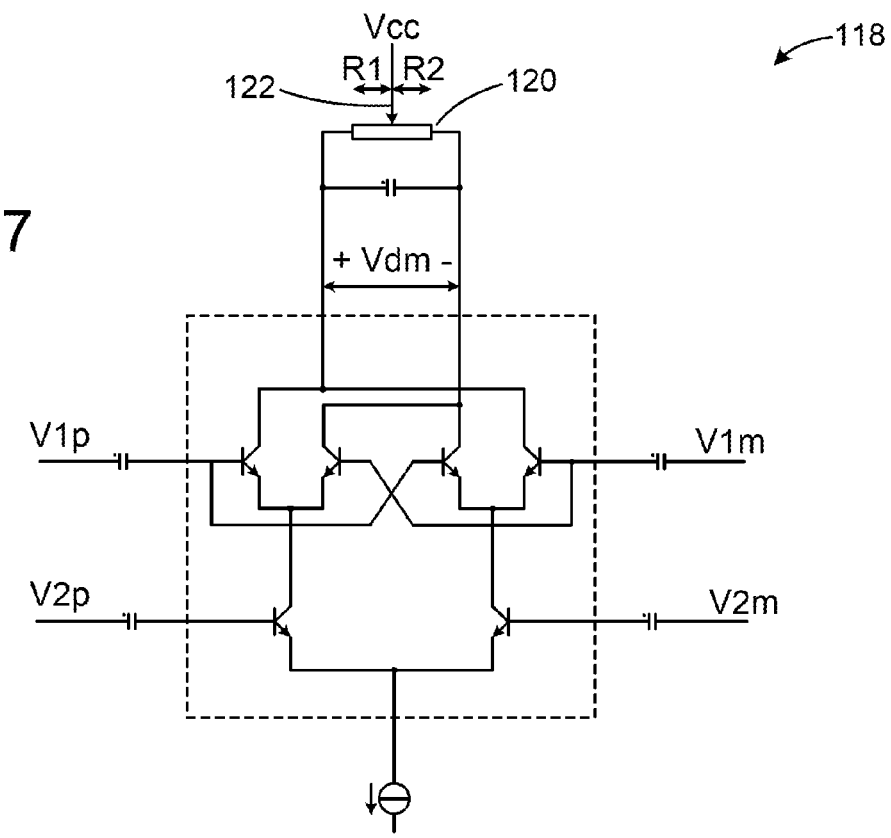
FIG. 7 is a schematic view of a potentiometer of the present invention, connected to the output of a Gilbert cell.

A system 118 is illustrated in FIG. 7. By keeping the sum of R1 and R2 constant but varying the difference between R1 and R2, this can be represented by a potentiometer 120 with its runner 122 connected to the supply voltage VCC. The potentiometer may be described as a variable resistor with three ports and it has the slidable runner 122. The runner 122 may be connected to the left branch and R1 is the resistor value between the left branch and the supply and R2 is the resistor value between the right branch and the supply. In this way, although the values of the resistors R1 and R2 may change the sum of the resistors R1 and R2 is always the same i.e. a constant.

In an adjusting step the runner 122 is adjusted i.e. shifted along the scale 124 until the differential voltage (Vdm) at the mixer output is zero (0 V), then:

$$Idm/Icm=(R2-R1)/(R2+R1)$$

Figure 8:
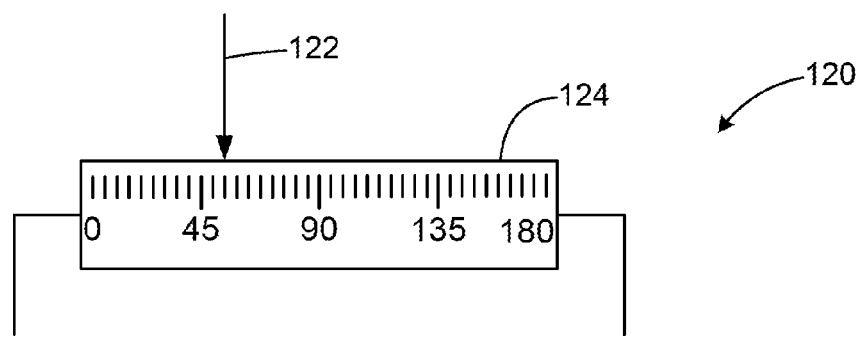
FIG. 8 is a symbolic representation of the relation between the mixer input phase difference and the runner position of the potentiometer shown in FIG. 7, when the mixer differential output voltage is zero.

FIG. 8 shows a detailed view of the potentiometer 120. Since R2+R1 is constant, the position of the runner 122 along scale 124 is a direct indication of the phase difference (when the runner is adjusted until Vdm=0V) where the extreme left position corresponds to 0 degrees, the middle position to 90 degrees and the extreme right position corresponds to 180 degrees. In other words, when the runner 122 is moved until the differential voltage is zero, then the phase difference can be read on the scale 124.

Of course, it is not possible to detect phase differences close to 0 and 180 degrees for the same reasons as in conventional detectors. The conversion from input phase to output current duty cycle follows the Δϕ formula (equation (1)) only when the mixer output currents are completely settled as a result of the sign transition of one input signal before the other signal changes polarity.

Figure 9:
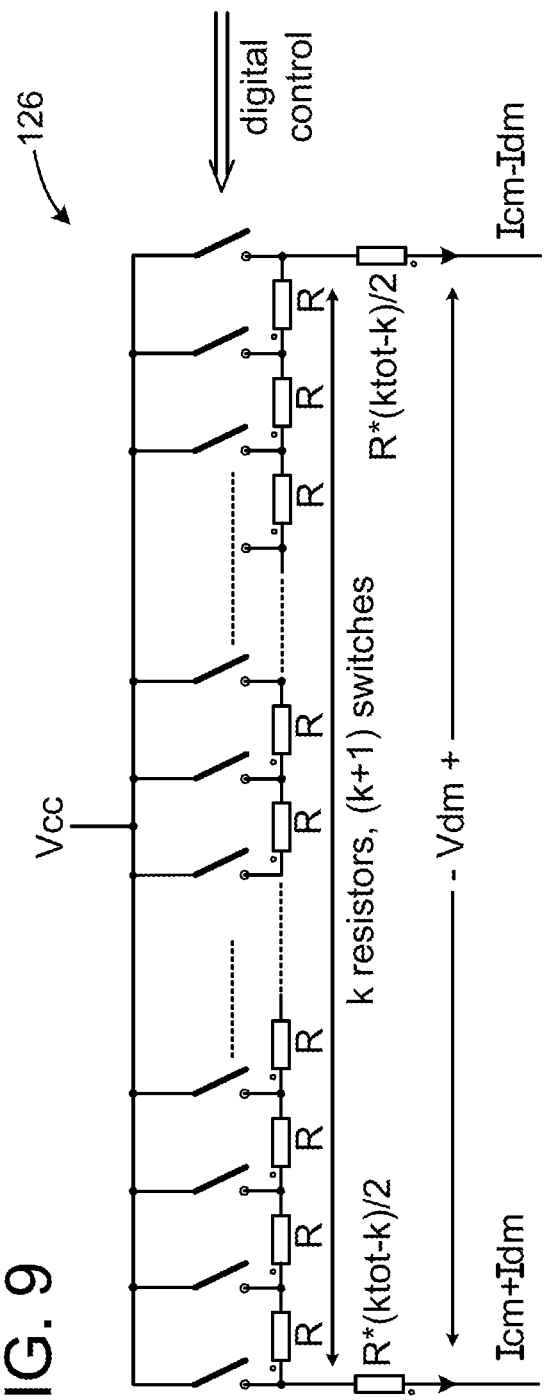
FIG. 9 is a schematic view of a digital potentiometer of the present invention having a resistor string.

A practical way to realize the adjustable potentiometer is by a resistor string with switches connected from the taps to the supply rail. The potentiometer connects or activates a certain number of resistors and the "runner" moves from the node of one resistor to the next until the differential voltage Vdm is zero in order to measure the phase difference. Only one switch will be closed at the same time. This can be controlled digitally. As shown in FIG. 9, the total resistance from left to right is ktot*R. In a way, device 126 may be treated as an electronic potentiometer similar to the analog potentiometer 118 in FIGS. 7-8. There are a (k) number of resistors with a value R with switches on each side and two fixed resistors at both ends with value {(ktot−k)/2}*R When one switch is closed and Vdm=0, then the mixer input phase difference is digitally defined by the closed switch position. This value is defined in an interval of (k/ktot)*180 degrees around 90 degrees in steps of 180/ktot degrees. It should be noted that a (small) series of resistors in the supply tap connection does not have any effect on any of the equations mentioned above. The switches in the potentiometer subcircuit can have some on-resistance without consequences. In the above arrangement, the switches can be realized with PMOS transistors.

Figure 17:
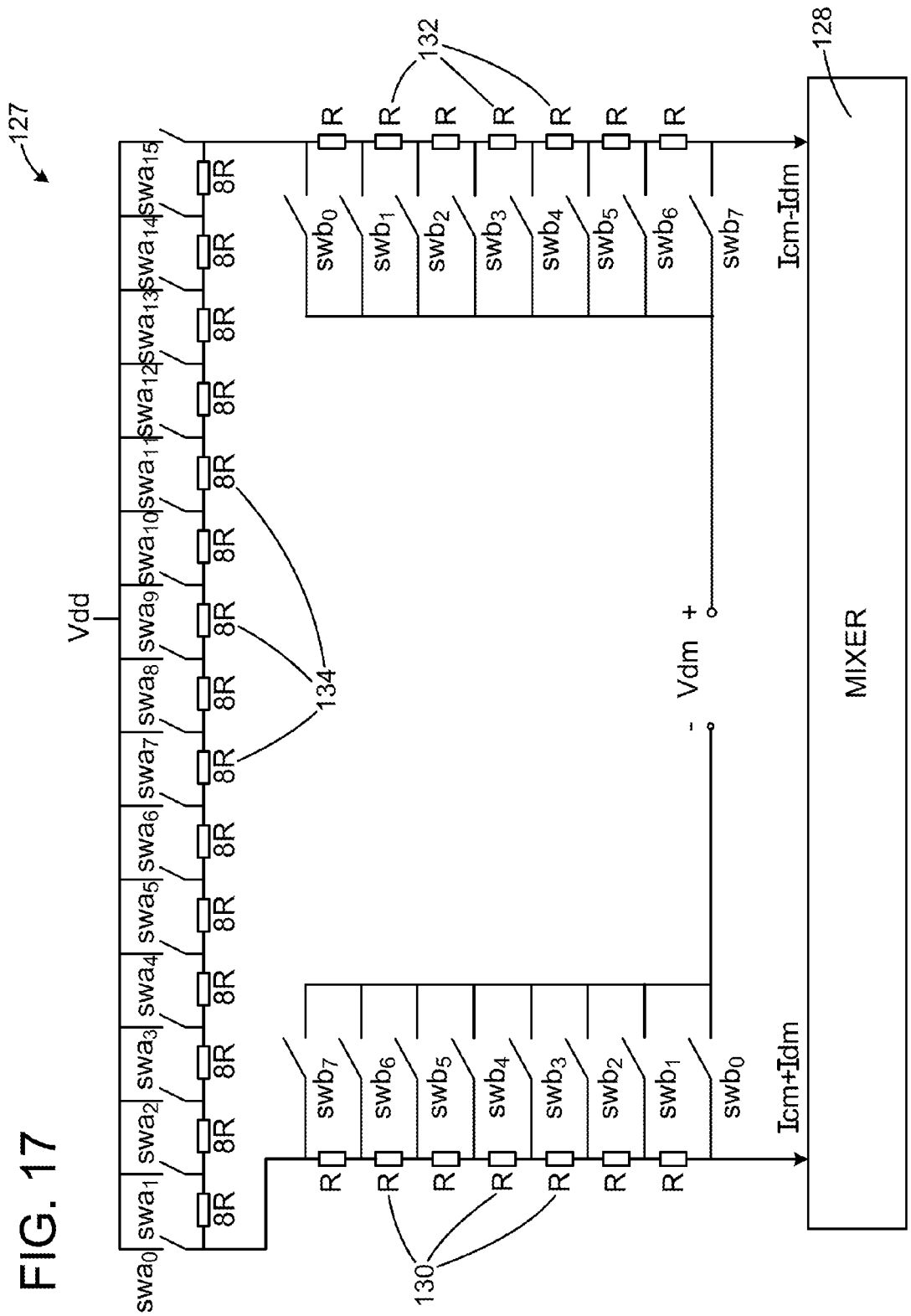
FIG. 17 is a schematic view of an alternative embodiment of a potentiometer of the present invention.

FIG. 17 is another embodiment of a digital potentiometer 127 that is connected to a mixer cell such as a Gilbert cell 128. The potentiometer 127 has a plurality of left resistors 130 all connected to switches and a plurality of right resistors 132 also all connected to switches. The potentiometer 127 has a horizontal row of resistors 134 each connected to switches that is equivalent to the runner 122 and scale 124 in FIGS. 7-8. The vertical rows of resistors 130, 132 may be used to fine tune the resistance so if a resistance of 34R is needed then the switch of the fourth resistor on the top row is activated and the switch to the second resistor in the resistor row 130 is activated so that the total is 4*8R+2R=34R. At the same time, the switch to the second to the last resistor in the resistor row 132 is also activated so that the sum of the resistors in rows 130 and 132 is constant. This arrangement realizes a potentiometer with less switches compared to a potentiometer according to the system of FIG. 9, when the same resolution is chosen. Similar to the device 126 in FIG. 9, the switch position along the resistors 134 indicate the phase difference of the two input signals when Vdm=0. The resolution of the potentiometer is set by the number of resistors used.

In general, the present invention related to a mixer (double-balanced or Gilbert cell) connected with its outputs to an adjustable load (such as a potento-meter) where a feedback mechanism settles when the differential output voltage of the mixer is stabilized to zero volt (or another desired value). It is to be understood that the mixer and the potentiometer can be realized and biased in various ways.

Figure 18:
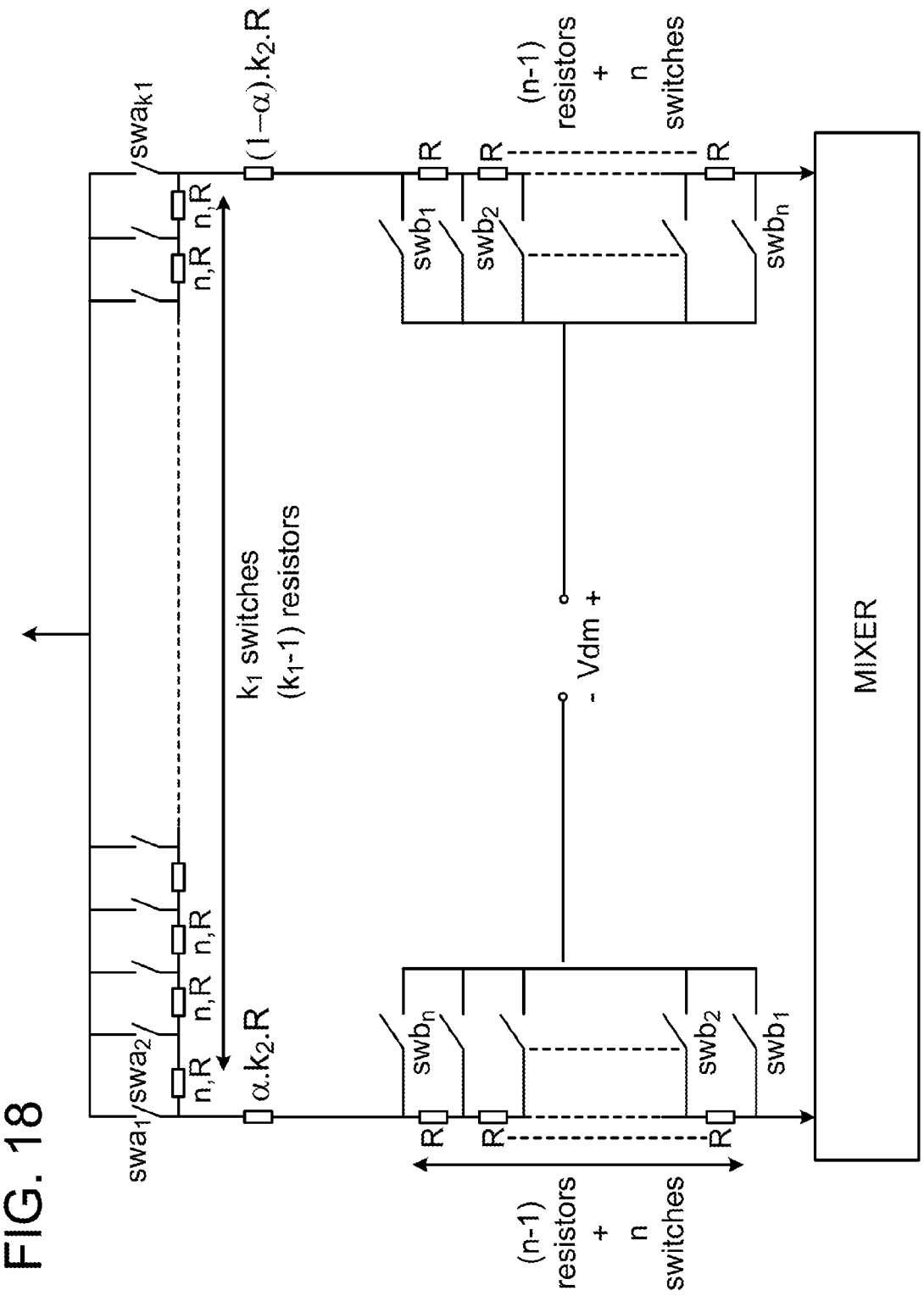
FIG. 18 is a schematic view of a potentiometer with several adjustable properties.

A number of possible potentiometer implementations are combined in FIG. 18. The horizontal row consists of k1 switches and (k1−1) resistors of value n·R, where R can be given any convenient value. Two fixed resistors with values α·k2·R and (1−α)·k2·R are inserted in the two vertical rows and determine the center phase (in the text so far, this was always 90 degrees but it can also be set to a different value) by means of factor α, where 0<α<1 and the switchable range of the potentiometer. The remainder of the two vertical rows consists of resistors with value R and switches that are controlled in groups of two in a similar way as the potentiometer shown in FIG. 17.

For the potentiometer of FIG. 18, the following properties are realized when it is used in a system according to the invention:

Center phase={90−90·{(1−2·α)/(k2+n·k1−1)}} degrees.

Range={(n·k1)/(n·k1+K2)}·180 degrees

Number of steps=n·k1

Step size=180/(n·k1+K2) degrees

Note that the potentiometer of FIG. 9 is a special case of the universal potentiometer of FIG. 18 with n=1 and α=0.5.

So far, the method of the present invention has been presented with a mixer with a tail current $I_{tail}$ connected to the ground rail and the runner of the potentiometer connected to the (positive) supply. Of course, this can also be done the other way around i.e. the tail current comes from the supply. The mixer may realized with complementary transistors (PNPs or PMOS, etc) and the runner of the potentiometer being connected to the ground rail. The switches of the potentiometer can be realized with NMOS transistors in that case. It is also possible to connect the (n-type transistors) mixer with the bottom pair to the ground rail directly and connect the current source between the supply rail and the runner of the potentiometer. Biasing of the mixer may in that case be realized with a special common mode bias loop. A complementary realization of this is also possible.

There are many applications that can make use of the relationship between the runner position and the input phase difference when the output differential voltage is zero. For example, there are applications where a feedback loop controls the runner position. There are also applications where the runner is placed in a fixed position and a loop controls the input phase difference.

Figure 10:
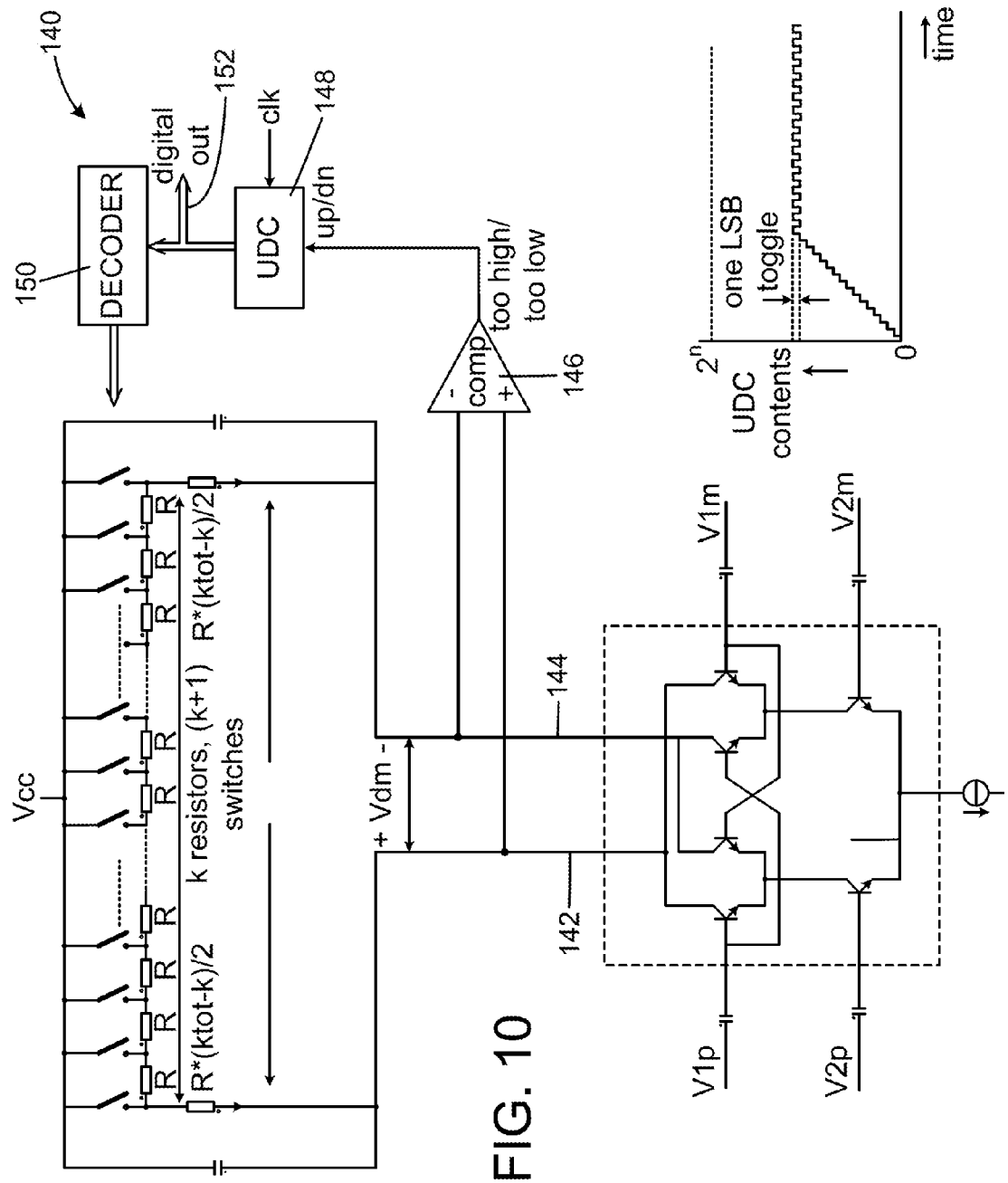
FIG. 10 is a schematic view of a phase detector with a digital read out.

FIG. 10 is a schematic view of a phase detector 140 with a digital read out. The two input signals 142, 144 are connected to the double balanced mixer with digital adjustable potentiometer load. A comparator 146 reads the sign of the differential voltage at the mixer output. The comparator 146 then uses this information to control the up/down port of an up-down counter (UDC) 148. The UDC counts up or counts down with 1 LSB at each clock cycle, depending on the value of the up/down input. The UDC contents are translated with simple logic in a control of the switches in the decoder block 150. The UDC contents ramps up or down until the comparator output changes state (when Vdm crosses 0V). Once settled, the UDC contents toggles or oscillates between two values, one LSB apart. Vdm is, in that case, alternately slightly positive and slightly negative. The digital contents 152 of the UDC represent the input phase difference. It is possible to replace the UDC with some other digital circuit that iteratively adjusts the runner position, based on the sign of Vdm (for instance based on a SAR algorithm).

Figure 11:
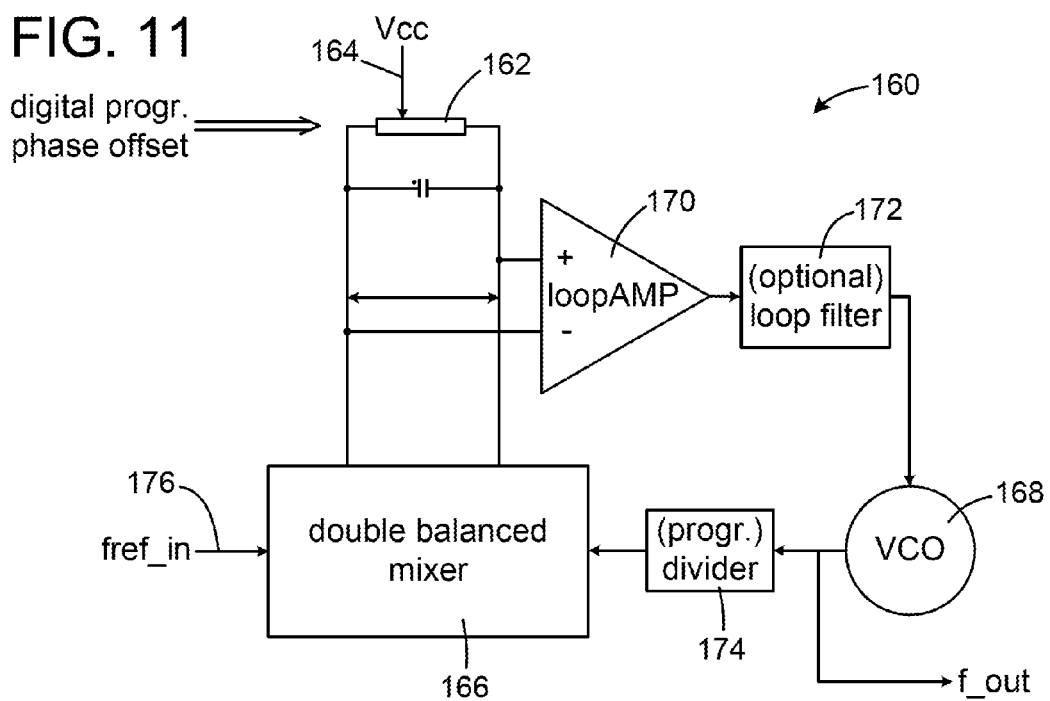
FIG. 11 is a schematic view of a PLL synthesizer loop with programmable output phase.

FIG. 11 illustrates a PLL synthesizer loop 160 with programmable output phase. The digital programmable potentiometer structure 162 which consists of a resistor string with switches to the supply rail, controlled by a digital word, where only one of the switches is closed at the same time, is from now on indicated with the simple potentiometer symbol 164, as shown in FIG. 11.

The potentiometer is switched to the desired position, corresponding to the required phase offset. The output of the mixer 166 is connected to a VCO (voltage controlled oscillator) 168 via a loop amplifier 170 and an optional loop filter 172 (in any order). After an (optional) divider 174, the VCO 168 is directed to the double balanced mixer (Gilbert cell) 166 together with the input reference frequency 176. Note that the double balanced mixer has differential inputs. This is not drawn for simplicity reasons. The loop realizes the programmed phase difference $\Delta\phi$ between the two (differential) inputs of the mixer 166. The VCO 168 has, in this, a phase shift that is (n) times larger: $n*\Delta\phi$, where (n) is the division ratio. The resolution of the phase steps is decreased in this case with (n). For that reason it is better to keep (n) low or to remove the divider 174 altogether.

Figure 12:
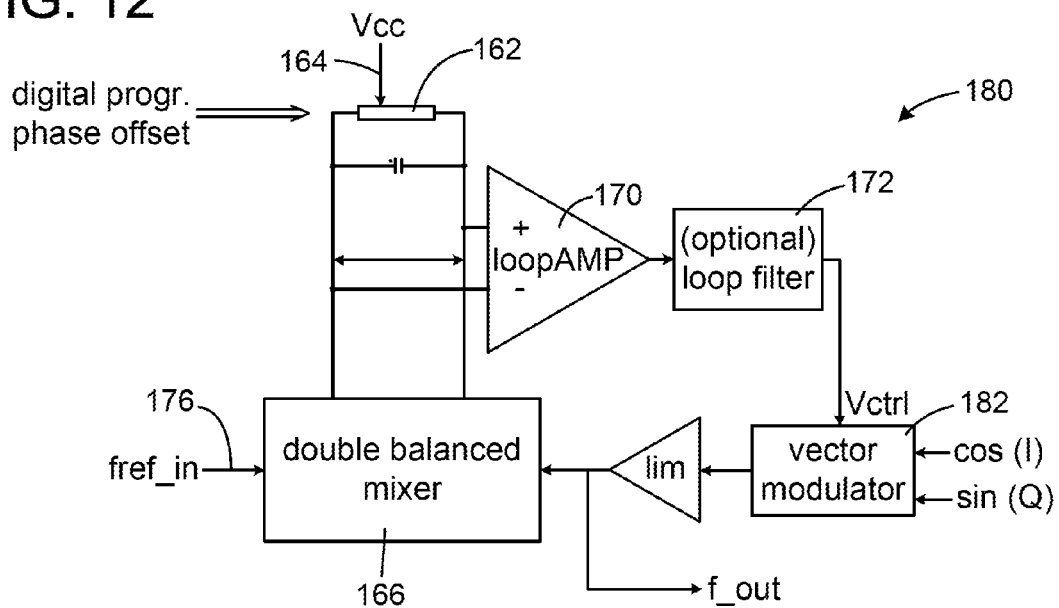
FIG. 12 is a schematic view of a phase loop with programmable output phase.

FIG. 12 is a schematic view of a phase loop 180 with programmable output phase. A vector modulator 182 is used instead of a VCO. This block adds a fraction of an I-signal (cosine) with a fraction of a Q-signal (sine) to generate a signal with a variable phase between 0 (the cosine) and 90 (the sine) degrees. The I- and Q-signals are of the same frequency as the reference signal fref_in 176 since they have the same origin. The mix between I and Q is controlled with a control voltage Vctrl.

Figure 13:
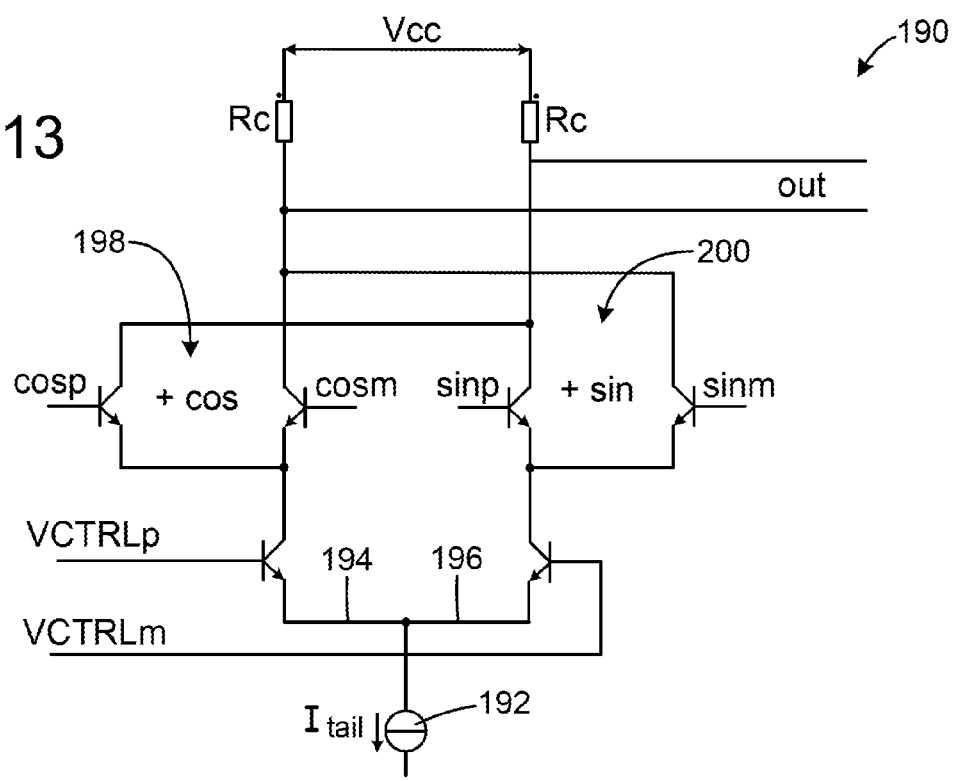
FIG. 13 is a schematic view of a vector modulator.

A suitable vector modulator 190 is shown in FIG. 13. A tail current 192 is divided between two differential pairs 194, 196 controlled by a control voltage Vctrl. For very positive Vctrl, the tail current is directed completely to the left upper pair 198 and the right upper pair 200 has no tail current at all. In that case, the input signal of the left pair 198 (the cosine signal) is amplified to the output completely. For a very negative value of Vctrl, it is the other way around and the input signal of the right pair 200 (the sine signal) is amplified to the output. In other situations, the output signal is an amplified mix of the cosine and sine signal and therefore has a controllable phase. Note that a phase error between the I-signal (cosine) and Q-signal (sine) does not affect the system. As long as there is a Vctrl that can result in the required output phase, the feedback loop can settle.

Figure 14:
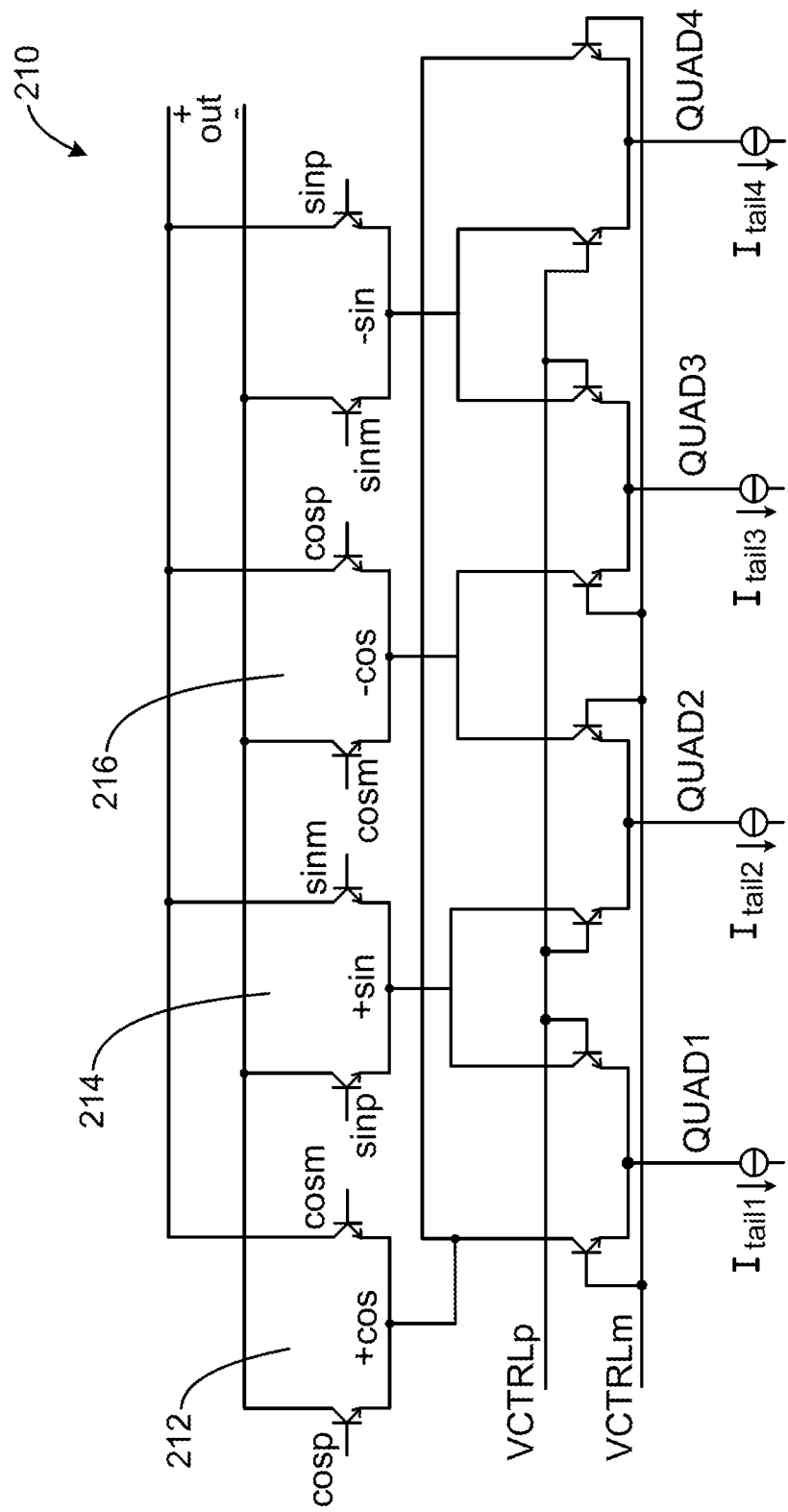
FIG. 14 is a vector modulator with controllable output phase of 360 degrees.

FIG. 14 shows a vector modulator 210 with programmable output phase of 360 degrees. The previous application was able to generate phases over 90 degrees (one quadrant) since the vector modulator could produce phases between 0 degrees (cosine) and 90 degrees (sine) by varying the input control voltage Vctrl over the complete range. In FIG. 14, the full 360 degrees can be generated by extending the vector modulator to a "4 quadrant vector modulator." The output current of this block can be directly converted into voltages by connecting two resistors to the supply rail, described in the earlier embodiments above. It can also be processed differently.

There are four quadrants defined: Quad1, Quad2, Quad3 and Quad4. Depending on the active quadrant, only one tail current is present, the others are zero. Quad1 can be recognized as the one quadrant vector modulator described before, which is able to generate output phases from 0 to 90 degrees (when going from cosine to sine). In Quad2, the output can travel between 90 and 180 degrees, in Quad3 from 180 to 270 degrees and in Quad 4 from 270 to 360 degrees which completes the circle. In order to guarantee a smooth and uninterrupted transition between the quadrants, the system 210 is set up such that the same output phase is generated with the same Vctrl in two succeeding phases i.e. from Quad1 to Quad 2, Quad 2 to Quad 3 and from Quad 3 to Quad 4. When in Quad1, going from a (very) negative Vctrl to a (very) positive Vctrl, the output phase travels from the cosine 212 to the sine 214. If the system is then switched to Quad2 while Vctrl is kept (very) positive, the output is still controlled by the same input i.e. the sine 214. If Vctrl is then gradually changed to (very) negative, the output travels from the sine to the 'minus cosine' 216 (from 90 to 180 degrees). Then system 210 may then be switched to Quad3, going back with Vctrl from (very) negative to (very) positive and the output smoothly goes from 180 to 270 degrees etc.

Figure 15:
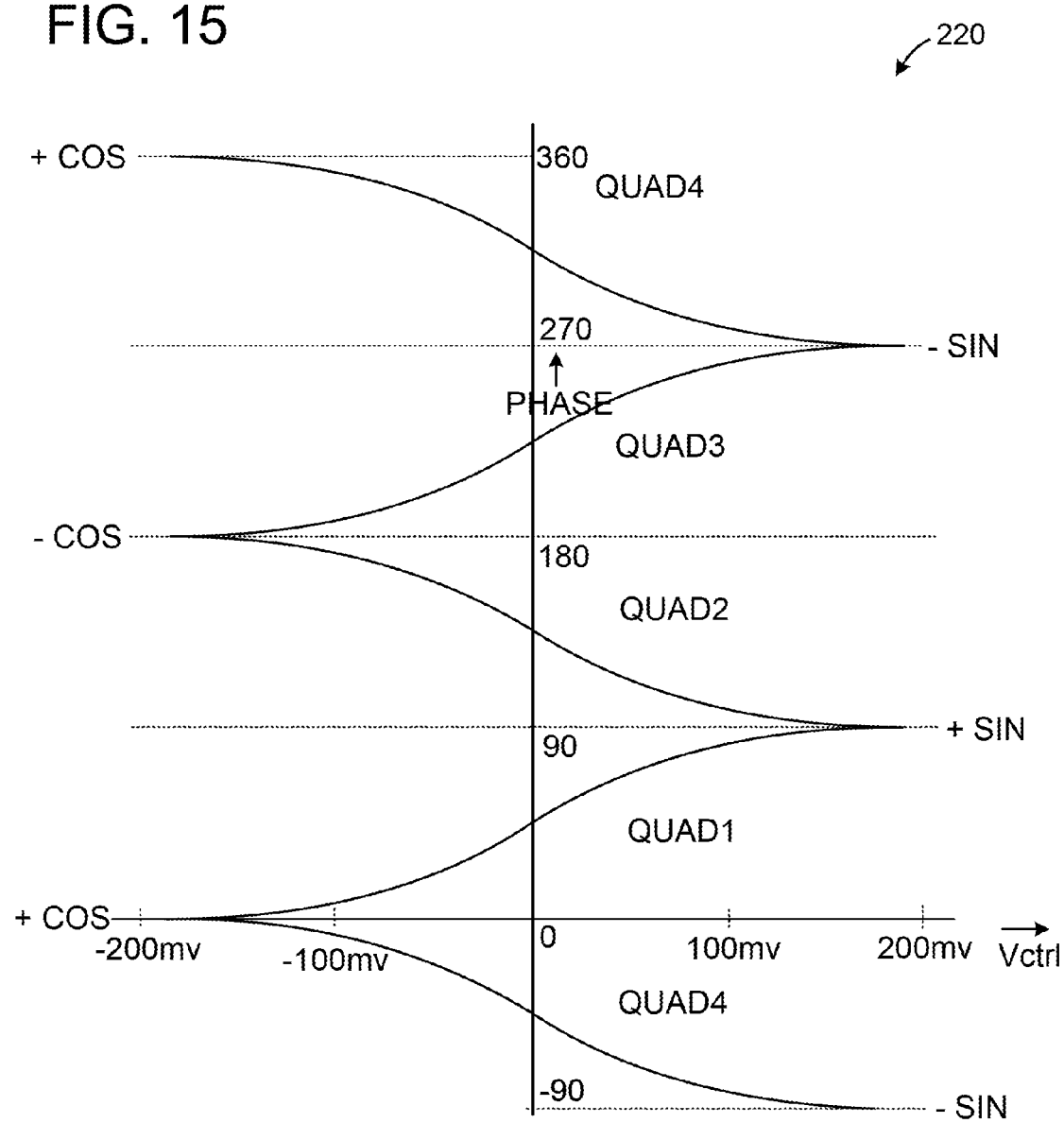
FIG. 15 is a schematic view of switching mechanisms between four Quadrants.

The switching mechanism 220 between the four Quadrants is illustrated in FIG. 15. The four quadrant vector modulator 210 is a block that constructs an output signal with a phase that can be controlled by choosing a quadrant and by applying a control voltage Vctrl. It uses a combination of a (minus) cosine or a (minus) sine input signal to achieve this. Depending on the active quadrant, the output phase increases or decreases with increasing Vctrl and the sign of the transfer gain of this block is quadrant dependent. For Quad1 and Quad3, the sign is positive; for Quad2 and Quad4 the sign is negative. When used in a feedback loop, this, preferably, should be corrected somewhere in such a way that there is always negative feedback.

Figure 16:
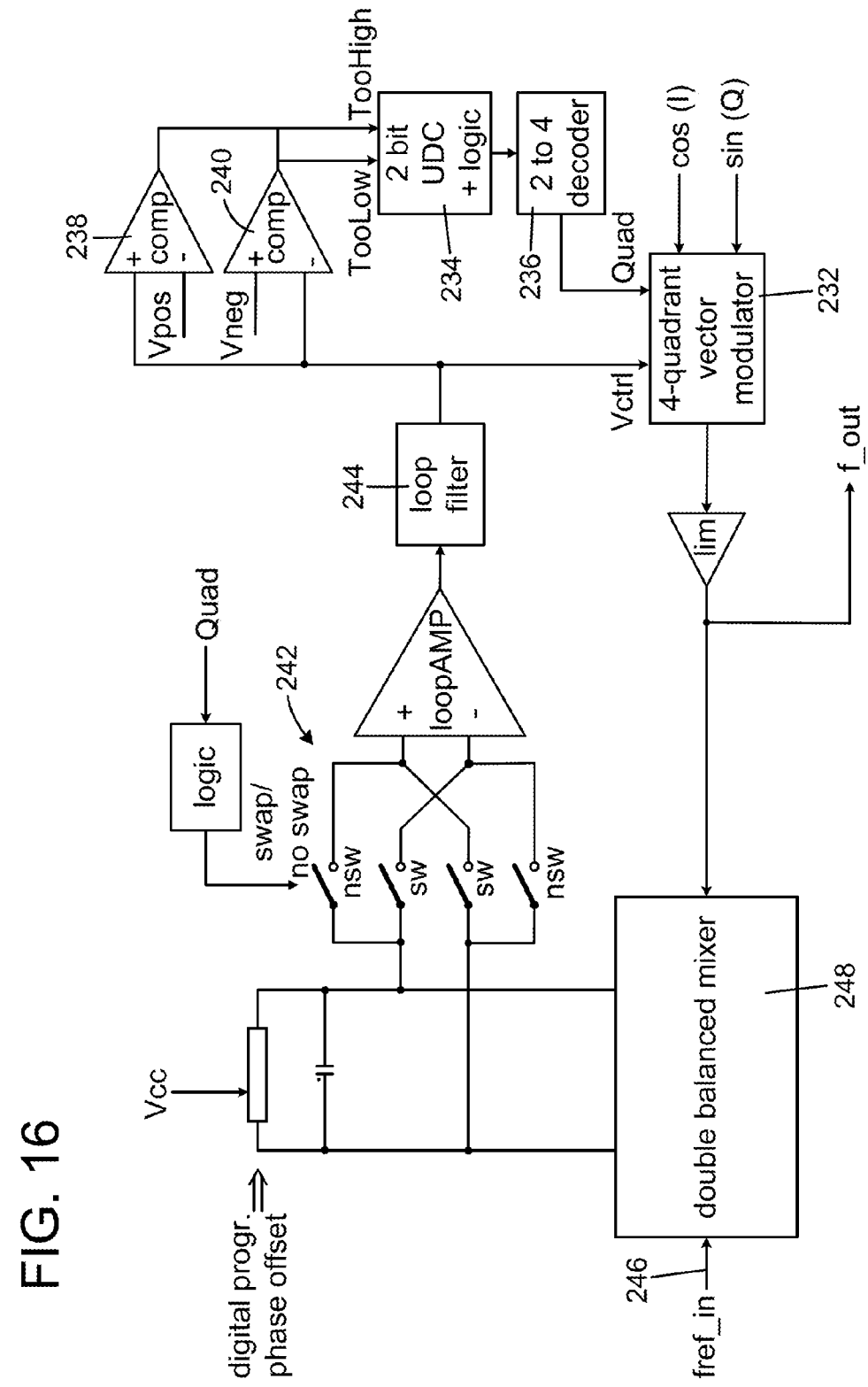
FIG. 16 is a schematic view of a second embodiment of an application of the present invention.

A complete 360 degrees programmable phase loop 230 with a 4-quadrant vector modulator 232 is shown in FIG. 16. The contents of a 2-bit UDC define the active quadrant which is passed to the vector modulator 232 via a 2 to 4 decoder 236. Two comparators 238, 240 are used to detect if the control signal Vctrl is either very negative (TooLow: below the comparator voltage Vneg), very positive (TooHigh: above Vpos) or neither. The switching mechanism may be described as shown below:

When in:
Quad1 and TooHigh: Count up to Quad2
Quad2 and TooHigh: Count down to Quad1
Quad3 and TooHigh: Count up to Quad4
Quad4 and TooHigh: Count down to Quad3
Quad1 and TooLow: Count down to Quad4
Quad2 and TooLow: Count up to Quad3
Quad3 and TooLow: Count down to Quad2
Quad4 and TooLow: Count up to Quad1

Preferably, this logic is incorporated in the 2-bit UDC 234.

Since the sign of the transfer gain from the input control voltage Vctrl to output phase of the vector modulator 232 is negative in Quad4 and Quad2 and positive in Quad1 and Quad3, the sign of the loop gain must be corrected for this. This is preferably done with the swap/no-swap signal, generated with simple logic from the quad information. The quadrant-dependent sign-inversion can be done anywhere in the loop but it is better if it does not result in instantaneous steps in Vctrl. For that reason, it is preferred to place the swapping switches 242 in front of the loop filter 244.

The 4-quadrant vector modulator 232 may be able to generate signals with phase differences from 0 to 360 degrees (with respect to the sine and cosine inputs), the adjustable potentiometer phase detector can only accurately detect phase differences in an interval of less than 180 degrees, relative to the phase of the input reference frequency fref_in 246 of the double-balanced mixer 248. If it is desirable to be able to generate any phase difference, it is possible to switch fref_in 246 as well. If the cosine and sine (I and Q) signals coming from a synthesizer for instance, are available, one of these signals can be used (inverted or non-inverted) as fref_in in the system 230. This enables the generation of any desired phase difference. Instead of inverting the reference signal fref_in in the system 320 (in order to realize a 180 degrees phase shift) it is also possible to use the original reference signal and mirror the potentiometer position relative to the center position and at the same time swap the potentiometer output. This avoids the placement of switches in the high frequency signal path. The last swapping action can be combined with the swapping switches 242 that are already present.

When discussing mechanisms with transistor circuits, it is important to be aware that there are different circuit implementations possible that realize the same mechanism such as using MOS transistors instead of bipolar transistors, complementary topologies (p-type instead of n-type etc.), implementing information in current domain instead of voltage domain or vice versa.

There are other possible alternative applications based on measuring Idm/Icm. For example, it is possible to direct each of the two single ended mixer output currents through a resistor (directly or via an active current to voltage converter) and convert these voltages with an ADC to the digital domain where the ratio Idm/Icm is calculated. It is also possible to convert the differential and common mode output currents separately to voltages and convert both with an ADC to the digital domain where their ratio is calculated. The output currents (2× single ended or differential mode and common mode) can be directly converted to the digital domain without first converting them to voltages.

While the present invention has been described in accordance with preferred compositions and embodiments, it is to be understood that certain substitutions and alterations may be made thereto without departing from the spirit and scope of the following claims.

I claim:

1. A method of determining an input phase differential between two input signals, comprising,
   providing a phase detector having pairs of transistors and having a first impedance (R1) connected to a first branch carrying a first signal (Iout_left) of the phase detector and a second impedance (R2) connected to a second branch of the phase detector carrying a second signal (Iout_right),
   setting the first signal (Iout_left) in the first branch as a first sum of a common mode output signal (Icm) and a differential mode output signal (Idm),
   setting the second signal (Iout_right) in the second branch as a second sum of the common mode output signal (Icm) minus the differential mode output signal (Idm), and
   determining an input phase differential ($\Delta\phi$) by using a ratio between the differential mode output signal (Idm) and the common mode output signal (Icm), and
   adjusting a relationship between the first impedance (R1) and the second impedance (R2) until a differential mode output voltage (Vdm) of the phase detector is zero, and
   determining the input phase differential ($\Delta\phi$) when the differential mode output voltage (Vdm) is zero.

2. The method of claim 1 wherein the common mode output signal (Icm) is a common mode output current and the differential mode output signal (Idm) is a differential mode output current.

3. The method of claim 1 wherein the common mode output signal is a common mode output voltage and the differential mode output signal is a differential mode output voltage.

4. The method of claim 2 wherein the method further comprises the step of using a ratio between the differential mode output current Idm and the common mode output current Icm.

5. The method of claim 3 wherein the method further comprises the step of using a ratio between the differential mode output voltage Vdm and the common mode output voltage Vcm.

6. The method of claim 2 wherein the method further comprises determining the ratio of the differential mode output current Idm and the common mode output current by adjusting an output load impedances of the phase detector in such a way that the output differential mode voltage (Vdm) is zero.

7. The method of claim 2 wherein the method further comprises the step of keeping a sum of a first resistor value of a first resistor and a second resistor value of the second resistor constant.

8. The method of claim 7 wherein the method further comprises the step of adjusting the first resistor value and the second resistor value while keeping the sum of the first resistor value and the second resistor value constant.

9. The method claim 8 wherein the method further comprises the step of adjusting a position of an adjustable runner of a potentiometer until the differential mode output voltage (Vdm) is zero and determining the input phase differential ($\Delta\phi$) by determining the position of the runner on a scale indicating the input phase differential ($\Delta\phi$).

10. The method according to claim 1 wherein the method further comprises shifting a zero crossing of a phase characteristic by connecting an asymmetrical load to the phase detector.

11. The method according to claim 1 wherein the method further comprises permitting the differential output voltage (Vdm) to oscillate between a positive value and a negative value.

12. The method according to claim 1 wherein the method further comprises providing a string of resistors with a number of switches connected to the resistor terminals where the switches are controlled in order to adjust the differential output voltage (Vdm).

13. The method according to claim 1 wherein the method further comprises using a vector modulator to generate a signal with a variable phase between 0 and 90 degrees.

14. The method according to claim 13 wherein the method further comprises using a four-quadrant vector-modulator to generate signals with a variable phase between 0 and 360 degrees.

15. The method according to claim 14 wherein the method further comprises using an output phase in a first quadrant (Quad1) and a second quadrant (Quad2) that is identical by using identical input control voltage to provide an uninterrupted transition between the first quadrant (Quad1) and the second quadrant (Quad2) and back.

16. The method according to claim 15 wherein the method further comprises using an identical output phase between the second quadrant (Quad2) and a third quadrant (Quad3) to provide an uninterrupted transition between the second quadrant (Quad2) and the third quadrant (Quad3) and back.

17. The method according to claim 16 wherein the method further comprises using an identical output phase between the third quadrant (Quad3) and a fourth quadrant (Quad4) to provide an uninterrupted transition between the third quadrant (Quad3) and the fourth quadrant (Quad4) and back.

18. The method according to claim 17 wherein the method further comprises using an identical output phase between the fourth quadrant (Quad4) and a first quadrant (Quad1) to provide an uninterrupted transition between the fourth quadrant (Quad4) and the first quadrant (Quad1) and back.

19. The method of claim 1 wherein the method further comprises adjusting a relationship between the first impedance (R1) and the second impedance (R2) until a differential mode output voltage (Vdm) of the phase detector is a value other than zero.

20. A method of setting a phase differential between two input signals, comprising,
  providing a phase detector having pairs of transistors and having a first resistor (R1) connected to a first branch of the phase detector carrying a first signal (Iout_left) and a second resistor (R2) connected to a second branch of the phase detector carrying a second signal (Iout_right),
  setting the first signal (Iout_left) in the first branch as a first sum of a common mode output signal (Icm) and a differential mode output signal (Idm), setting the second signal (Iout_right) in the second branch as a second sum of the common mode input signal (Icm) minus the differential mode output signal (Idm),
  setting a relationship between a first resistor value of the first resistor (R1) and a second resistor value of the second resistor (R2) corresponding to a required phase differential and
  adjusting a phase of the first signal or the second signal until a differential mode output voltage (Vdm) of the phase detector is zero.

21. The method of claim 20 wherein a sum of the first resistor (R1) and the second resistor (R2) is constant.

22. The method of claim 20 wherein the method further comprises adjusting a phase of the first signal or the second signal until a differential mode output voltage (Vdm) of the phase detector is a value other than zero.

* * * * *